United States Patent [19]
Taniguchi et al.

[11] Patent Number: 6,021,368
[45] Date of Patent: Feb. 1, 2000

[54] POSITION DETECTING SWITCH-COMBINED ELECTRONIC CONTROL UNIT FOR AUTOMATIC TRANSMISSION

[75] Inventors: Takao Taniguchi; Nobuaki Miki; Ken Kiyama; Naotaka Murakami; Naoto Ogasawara; Toshiya Morishita; Takenori Kano, all of Ango, Japan

[73] Assignee: Aisin AW Co., Ltd., Anjo, Japan

[21] Appl. No.: 08/976,040

[22] Filed: Nov. 21, 1997

[30] Foreign Application Priority Data

Nov. 22, 1996 [JP] Japan .................................. 8-325899

[51] Int. Cl.⁷ ...................................................... G06F 15/00
[52] U.S. Cl. .................. 701/51; 701/55; 701/62; 701/87; 477/34; 477/97; 477/166; 318/3; 318/9; 318/159
[58] Field of Search ................... 701/51, 55, 87, 701/62; 477/34, 97, 166; 318/159, 3, 9

[56] References Cited

U.S. PATENT DOCUMENTS

| | | | |
|---|---|---|---|
| 4,499,542 | 2/1985 | Hamajima et al. | 701/62 |
| 4,517,646 | 5/1985 | Magnusson et al. | 701/62 |
| 4,523,281 | 6/1985 | Noda et al. | 701/62 |
| 5,005,687 | 4/1991 | Kurihara et al. | 192/0.073 |
| 5,140,871 | 8/1992 | Goto et al. | 74/866 |

FOREIGN PATENT DOCUMENTS

| | | |
|---|---|---|
| 196 21 781 A1 | 6/1966 | Germany . |
| 6113368 | 4/1994 | Japan . |
| WO 92/17719 | 10/1992 | WIPO . |

*Primary Examiner*—William A. Cuchlinski, Jr.
*Assistant Examiner*—Yonel Beaulieu
*Attorney, Agent, or Firm*—Oliff & Berridge, PLC

[57] ABSTRACT

A compact-sized position detecting switch-combined electronic control unit disposed on the main body of an automatic transmission and used for detecting range positions chosen by a driver during a shifting operation. The control unit has a base board on which a plurality of elements are arranged, including a microcomputer containing an automatic transmission control program, and a position detecting switch whose detecting portion is connected to the microcomputer. The base board and the position detecting switch are disposed in a single case. The position detecting switch has a rotor and a plurality of non-contact sensors disposed on the base board. The microcomputer contains a learning control program for calculating and correcting any positional deviation in the rotational angle of the rotor with respect to each sensor on the basis of signals from the sensors corresponding to rotation of the rotor. Some of the elements on the base board are arranged outside the range of rotation of the rotor.

27 Claims, 10 Drawing Sheets

FIG. 11a

| Position | P | R | N | D | 3 | 2 | L |
|---|---|---|---|---|---|---|---|
| Moving Direction, Number Pulses from N | -15 ∫ | -3 ∫ -14 | 2 ∫ -2 | 3 ∫ 10 | 11 ∫ 17 | 18 ∫ 26 | 27 ∫ |

FIG. 11b a = 2

| POSITION | P | R | N | D | 3 | 2 | L |
|---|---|---|---|---|---|---|---|
| Moving Direction, Number Pulses From N | -14 ∫ | -1 ∫ -13 | 3 ∫ -1 | 11 ∫ 4 | 18 ∫ 12 | 27 ∫ 19 | ∫ 28 |

FIG. 11c a = 4

| POSITION | P | R | N | D | 3 | 2 | L |
|---|---|---|---|---|---|---|---|
| Moving Direction, Number Pulses From N | -16 ∫ | -4 ∫ -15 | 1 ∫ -3 | 9 ∫ 2 | 16 ∫ 10 | 25 ∫ 17 | ∫ 26 |

POSITION DETECTING SWITCH-COMBINED ELECTRONIC CONTROL UNIT FOR AUTOMATIC TRANSMISSION

INCORPORATION BY REFERENCE

The entire disclosure of Japanese Patent Application No. Hei 08-325899 filed on Nov. 22, 1996, including the specification, drawings and abstract, is incorporated herein by reference in its entirety.

BACKGROUND OF THE INVENTION

1. Field of Invention

The invention relates to a control unit of an automatic transmission. More particularly, the invention relates to a control unit that combines an electronic control device for speed-shift control and a position detecting switch. The control unit is disposed on the main body of an automatic transmission and is used for detecting range positions chosen by a driver during a selecting operation.

2. Description of Related Art

Conventional automatic transmissions are designed to control a hydraulic pressure control device incorporated into the main body of the transmission. The conventional transmissions use an electronic control device to automatically perform the necessary speed-shift within a range selected while driving. The main body of the automatic transmission is connected to the engine of a vehicle and installed in an engine compartment. The electronic control device, needing to be located in an ideal temperature environment, is placed separate from the engine, such as, for example, in a passenger compartment.

As separate components, the automatic transmission main body and the electronic control device are subject to thorough quality control. Even when they are connected, quality control is required because the automatic transmission main body and electronic control device must function as intended when assembled in a final connected state. Because the connection of an automatic transmission body and an electronic control device is performed at the installation stage, it is impossible to control the automatic transmission main body and electronic control device that are to be connected in a one-to-one correspondence before the installation stage. Therefore, there is a need to adjust the automatic transmission main body and counter-part electronic control device such that they conform to each other after they are installed in a vehicle. Due to the above-mentioned circumstances, total quality control of automatic transmissions is a difficult task requiring many manhours.

The electronic control device is designed to output signals for the hydraulic pressure control device in the automatic transmission main body to speed-shift based on various data stored in the electronic control device, and with information regarding the engine input from an engine control computer. The electronic control device outputs the signals in accordance with signals input from sensors provided on the automatic transmission main body. The sensors are designed to detect various pieces of information regarding the transmission. Therefore, long wire harnesses are required for connecting the electronic control device and automatic transmission. The long wire harness results in an increase in cost, an increase in the occurrence of electronic noise and an increase in the number of manhours needed for wiring and wire-bundling. Moreover, a significant amount of space is required for the wiring.

To avoid these drawbacks, an attempt has been made to put an automatic transmission main body and an electronic control device in a one-to-one correspondence by combining the components into a single unit. For example, Japanese Patent Publication No. Hei 5-70023 discloses an automatic transmission main body and an electronic control device combined by incorporating the electronic control device into the case of a position detecting switch. The position detecting switch is conventionally disposed on an automatic transmission casing for outputting an electric signal to the electronic control device indicating a range position chosen by a driver during a selecting operation.

However, the mere integration of the two components into a single unity as disclosed in the above-mentioned example, results in several drawbacks. Because the engine, automatic transmission and other devices are located close to each other in the engine compartment of a vehicle, placing a large-size component, such as the integrated components, on the outside of the automatic transmission casing interferes with other devices. To avoid interfering with the other devices, the integrated components disposed on the outer surface of the automatic transmission casing need to be compact. However, in the above-mentioned example, the electronic control device is merely placed inside the case of the position detecting switch with no particular consideration taken with regards to the problem of space within the engine compartment.

Since the position detecting switch is designed to detect an operational position of a manual valve disposed in the hydraulic pressure control device based on the rotational displacement of a manual shaft linked to the manual valve, any deviation between the position of the manual valve and the range position detected by the position detecting switch must be eliminated. Therefore, an operation of establishing precise conformity in the positional relationship between the two components, that is, range position alignment, is required during assembly. To perform the range position alignment, typically the manual shaft linked to the manual valve and the rotor of the position detecting switch are first connected in a manner that prevents relative rotation thereof. Next, the position detecting switch case is turned around the shaft of the rotor until the range position indicated by the position detecting switch conforms to the position of the manual shaft. The case is then fixed to an outer surface of the automatic transmission casing by bolts or the like. As such, space must be allotted to mount the position detecting switch on the automatic transmission casing, as well as space that allows the rotation of the case around the shaft, in addition to space to be occupied by the external shape of the case. That is, the space required to mount the position detecting switch inevitably includes a dead space that is no longer needed after range position alignment is established.

SUMMARY OF THE INVENTION

It is an object of the invention to provide a compact electronic control unit that combines a position detecting switch and an electronic control device for effectively using an otherwise dead space that is indispensable for the range position alignment of the position detecting switch.

It is another object of the invention to increase the compactness of the electronic control unit by maximizing the number of elements of the electronic control device located in a space needed for the position detecting switch.

It is yet another object of the invention to increase the compactness of the electronic control unit by reducing the base board area of the electronic control device through the efficient arrangement of the elements.

It is another object of the invention to allow for the learning control of the position detecting switch through a microcomputer provided in the electronic control device.

It is yet another object of the invention to improve the precision in detecting the signals needed for learning control.

It is another object of the invention to prevent the false detection of position detection signals that include the signals needed for learning control.

It is also an object of the invention to eliminate the need for a wire or cable connection between the position detecting switch and the electronic control device base board.

In order to achieve the above and other objects, and to overcome the shortcomings in the prior art, a position detecting switch-combined electronic control unit for an automatic transmission according to the preferred embodiment of the invention includes a base board on which a plurality of elements, including a microcomputer containing an automatic transmission control program, and a position detecting switch, whose detecting portion is connected to the microcomputer, are disposed. The position detection switch and base board are disposed together within a case. The position detecting switch includes a rotor and a plurality of non-contact sensors that are provided on the base board. The non-contact sensors are placed in proximity to the rotor to detect the rotation of the rotor. The microcomputer contains a learning control program for calculating and correcting any positional deviation in the rotational angle of the rotor with respect to each non-contact sensor on the basis of a signal from each non-contact sensor. At least some elements on the base board are arranged outside the rotor's range of rotation.

The size of the position detecting switch case is increased within a limited occupying space by an amount corresponding to the size of the space that is no longer required after the range position alignment is performed. By placing the electronic control elements in the increased portion, the position detecting switch and the electronic control device can be integrated into a compact control unit.

The electronic control elements are placed on both sides of the base board. The electronic control elements having dimensions equal to or small enough to fit between the base board and the rotor are disposed in the portion of the base board that overlaps the locus of the rotor's range of rotation. The elements having dimensions too large to fit between the base board and the rotor are radially placed outside the portion of the base board that overlaps the rotor's range of rotation. This embodiment combines the position detecting switch and electronic control device into a compact control unit.

By distributing the electronic control elements to both sides of the base board, the base board dimension in the direction of the board surface is reduced. This provides a compact control unit by combining the position detecting switch and electronic control device.

The rotor includes multiple rows of slits that allow the non-contact sensors to output signals. At least two of the rows are learning control slits that extend from one end side of the rotor to other end side, so that the non-contact sensors output incremental signals to the microcomputer in accordance with the rotation of the rotor, thereby enabling learning control using a simply-constructed position detection switch.

The learning control slit rows are formed in the radially outward portion of the rotor. Since the learning control slit rows are formed in a region of the rotor with ample space, each slit opening can be made larger than the opening in a case where the slit rows are formed in the radially inward portion of the rotor. This increases the precision of the signal detection, thereby providing more precise learning control.

The radially outer edge portion of the rotor has an increased thickness, while the inner portion of the rotor, in which the rows of slits are formed, has a reduced thickness. This combination prevents sensor output reflection and false detection while retaining the rotor's strength. This is true because if the slit portion of the rotor is thick, a side wall surface of a slit opening may reflect sensor output, which may reach the input portion, thereby causing false detection.

An output and an input portion of each non-contact sensor is arranged on the base board, thereby eliminating the need for a wire or cable connection between the position detecting switch and the non-contact sensors and reducing the cost and susceptibility to electromagnetic noise effects of the combined control unit.

BRIEF DESCRIPTION OF THE DRAWINGS

The invention will be described in conjunction with the following drawings in which like reference numerals designate like elements and wherein:

FIG. 11a is a base line map illustrating the relationship between the range positions of the position detection switch and the rotor moving directions and number of output pulses from the neutral position of the combined control unit of FIG. 1 where no corrections are needed;

FIG. 11b is a correction map illustrating the relationship between the range positions of the position detection switch and the rotor moving directions and number of output pulses from the neutral position of the combined control unit of FIG. 1 where corrections are needed and a=2;

FIG. 11c is a correction map illustrating the relationship between the range positions of the position detection switch and the rotor moving directions and number of output pulses from the neutral position of the combined control unit of FIG. 1 where corrections are needed and a=4;

DETAILED DESCRIPTION OF PREFERRED EMBODIMENTS

Figure 1:
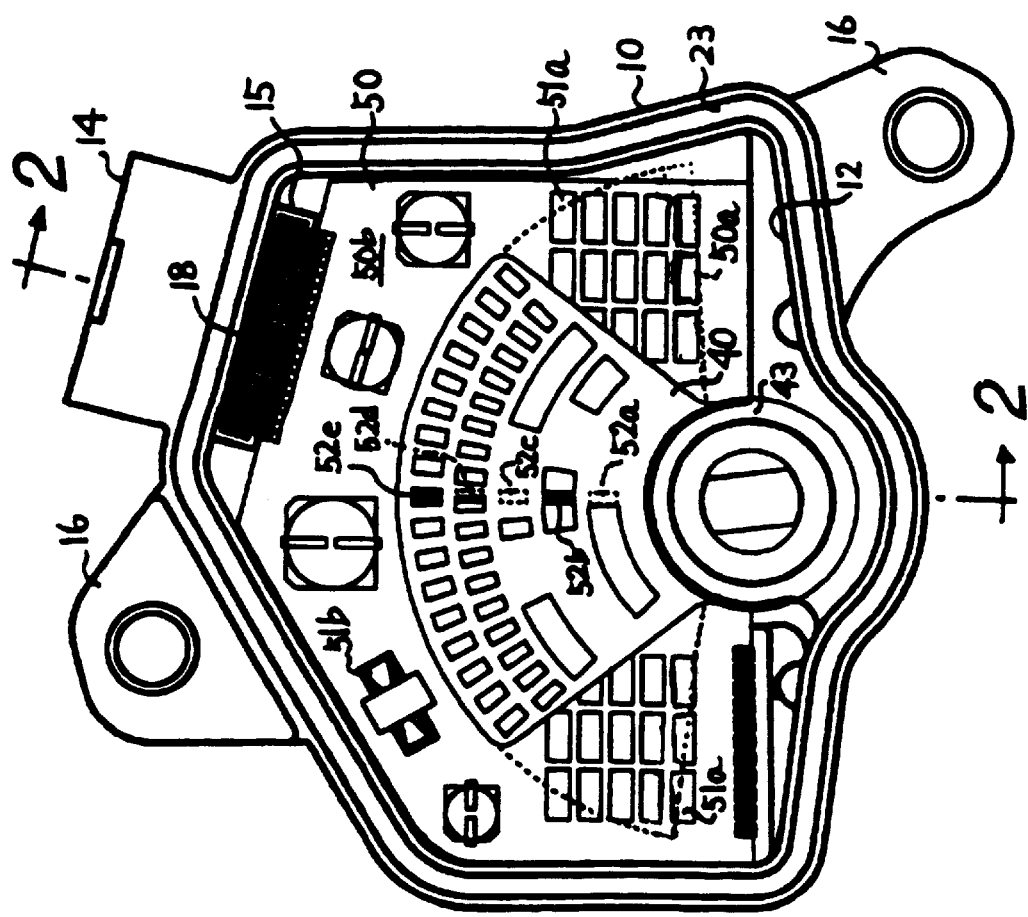
FIG. 1 is a plan view of the position detecting switch-combined electronic control unit for an automatic transmission of the invention.

While the invention will hereafter be described in connection with the preferred embodiment thereof, it will be understood that it is not intended to limit the invention to this embodiment. On the contrary, it is intended to cover all alternatives, modifications and equivalents that may be included within the spirit and scope of the invention as defined by the appended claims.

Hereafter, a detailed description of the embodiment of the position detecting switch-combined electronic control unit of this invention is provided with reference to the drawings. In the drawings, like reference numerals have been used throughout to designate like elements.

Figure 2:
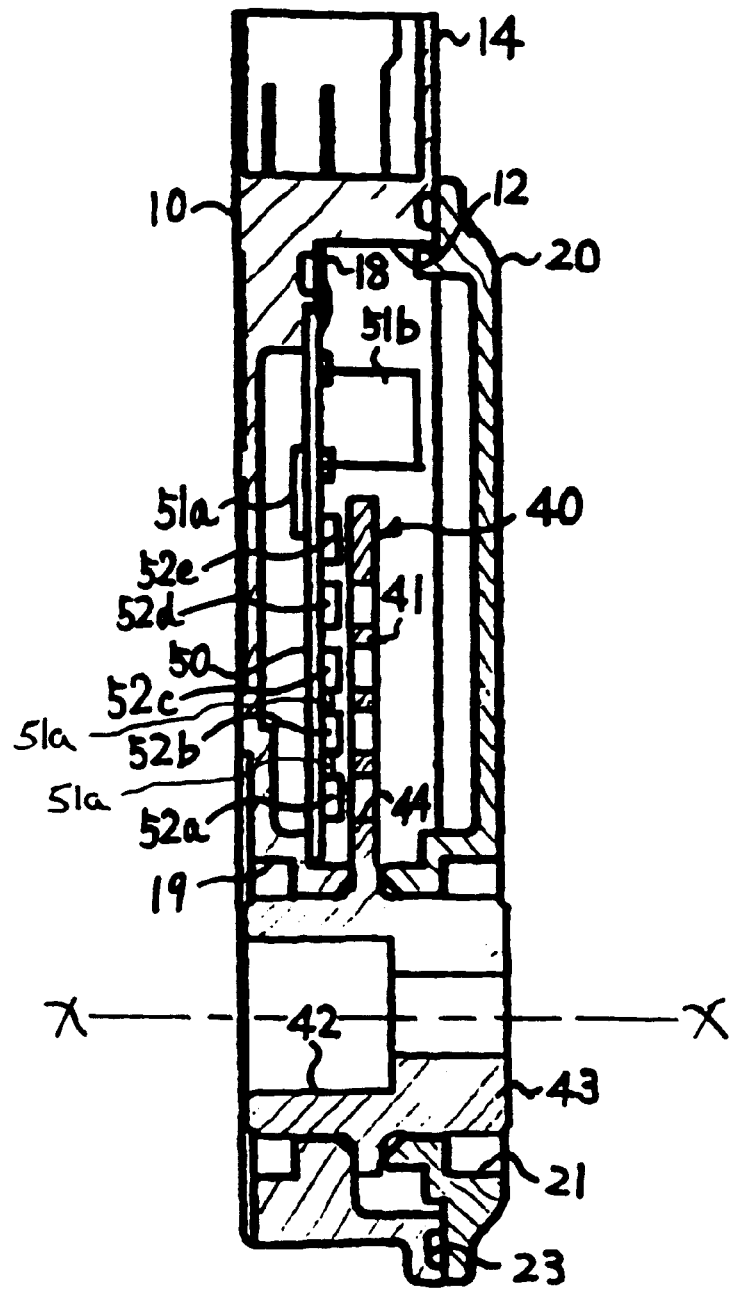
FIG. 2 is a sectional view of the combined control unit of FIG. 1 taken along section line 2—2.

FIGS. 1 and 2 are plan and sectional views, respectively, illustrating the structural configuration of a position detecting switch-combined electronic control unit. The combined control unit has a base board 50 with a position detecting switch disposed thereon, the base board 50 being contained in a single case 10. A plurality of circuit elements 51a and 51b, including a microcomputer containing an automatic transmission control program, are also disposed on the base board 50. The position detecting switch has a detecting portion connected to the microcomputer. The position detecting switch also includes a rotor 40, and a plurality of non-contact sensors 52a–52a. The non-contact sensors 52a–52a are disposed in proximity to the rotor 40 and are used for detecting the rotational angles of the rotor 40.

According to the invention, the microcomputer contains a learning control program for calculating and correcting any positional deviation in the rotational angle of the rotor 40 with respect to the sensors 52a–52a based on signals from the sensors 52d and 52e corresponding to the rotation of the rotor 40. Some of the circuit elements 51a and 51b on the base board 50 are disposed outside the rotor's 40 range of rotation. Elements 51b have heights equal to or greater than the clearance required to fit between the rotor 40 and the base board 50 and will be hereinafter referred to as "tall elements" 51b. As shown in FIG. 2, the elements 51a and 51b are placed on both sides of the base board 50.

Figure 3:
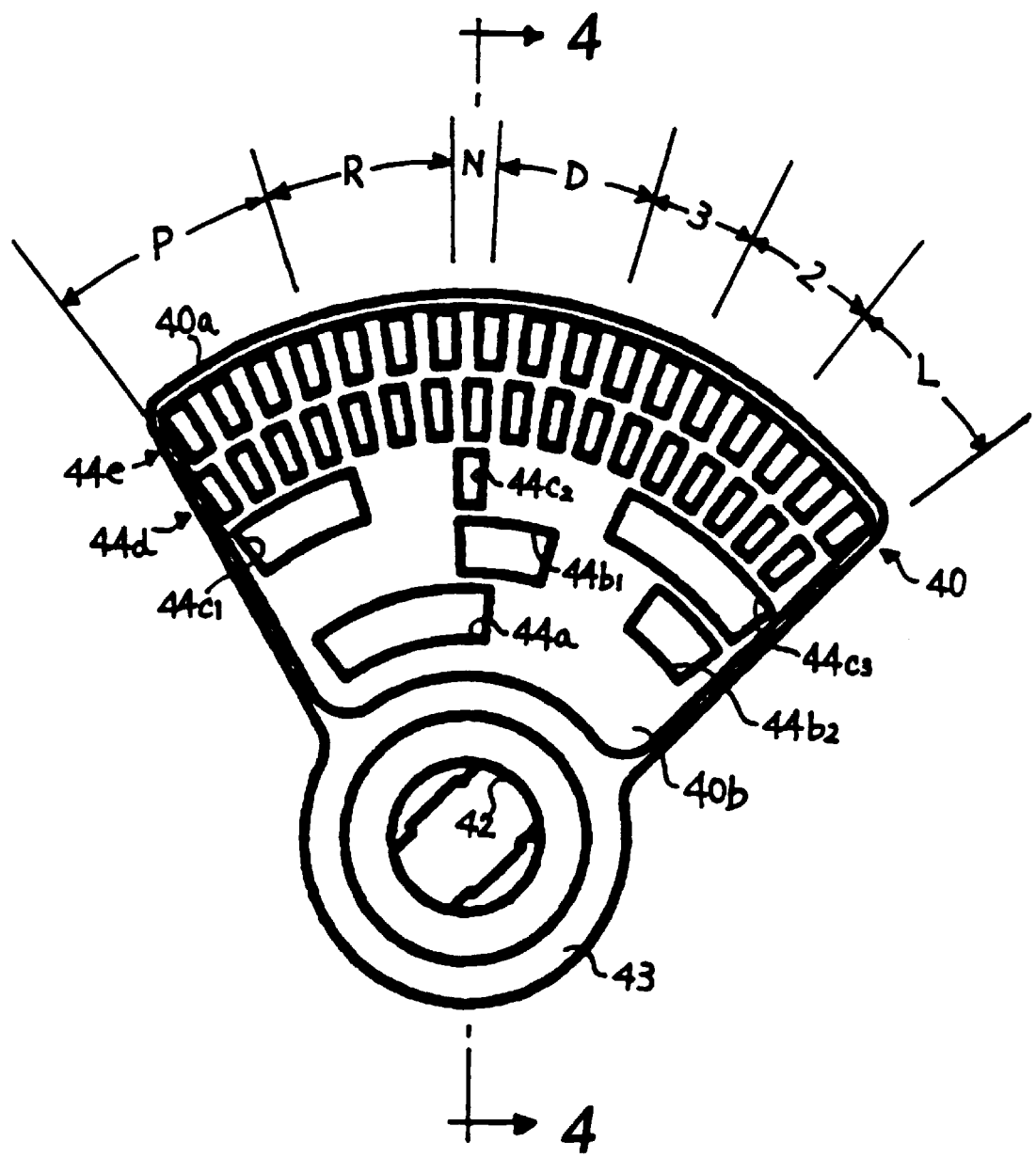
FIG. 3 is a plan view of the position detecting switch rotor of the combined control unit of FIG. 1.
Figure 4:
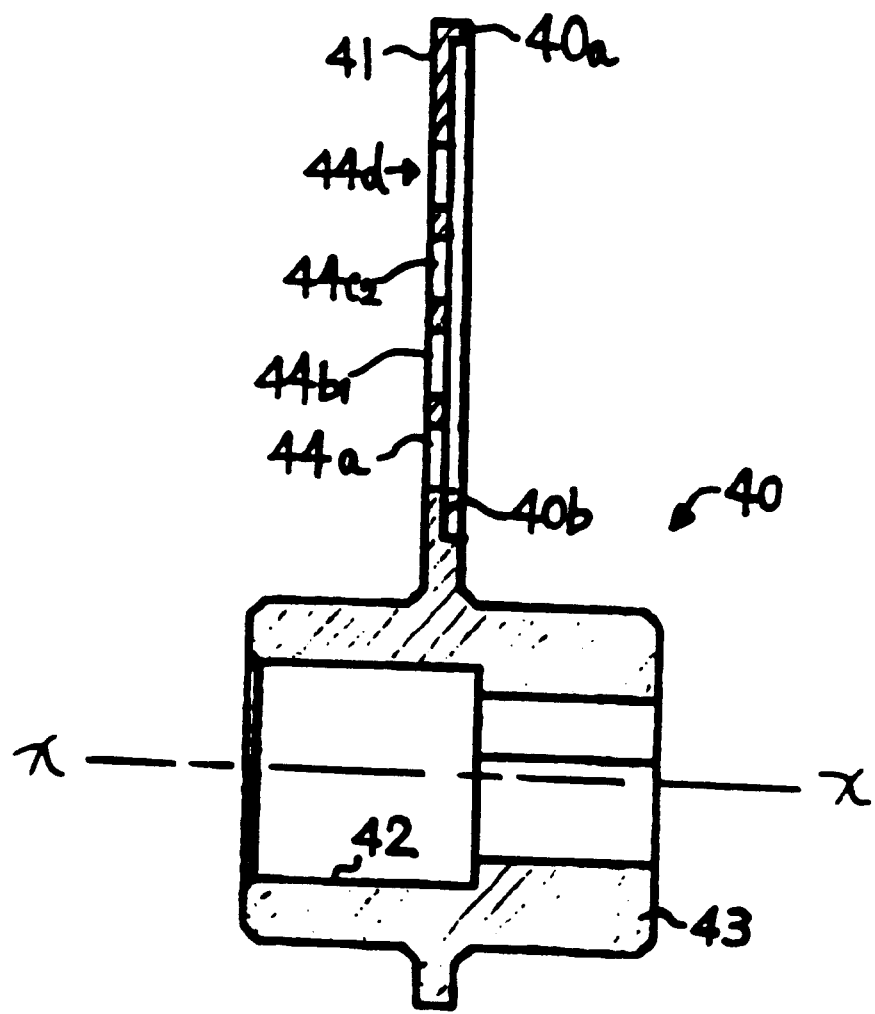
FIG. 4 is a sectional view of the position detecting switch rotor of FIG. 3 taken along section line 4—4.

FIG. 3 and FIG. 4 are plan and sectional views, respectively, of the rotor 40. The rotor 40 has a plurality, such as, for example, five as depicted in this embodiment, of slit rows 44a–44e that cause the non-contact sensors 52a–52a to output signals. At least two of the slit rows 44d, 44e are formed as learning control slit rows that extend from one side of the rotor 40 to other side of the rotor 40 so that the non-contact sensors 52d and 52e output incremental signals to the microcomputer in accordance with the rotation of the rotor 40. The learning control slit rows 44d and 44e are formed in a radially outward portion of the rotor 40, that is, outwardly of the other slit rows 44a–44c, so that the width of each slit 44d and 44e can be increased to improve the precision of the signal detection.

The rotor 40, which constitutes a switching means for the non-contact sensors 52a–52a, has a thick portion 40a at its outer edge portion. The increased thickness of the rotor 40 at the thick portion 40a retains the parallel posture retaining strength so that the required clearance, or gap, between the rotor 40 and the non-contact sensors 52a–52a is maintained regardless of the rotational position of the rotor 40. Furthermore, to prevent detection errors, the portion where the slit rows 44a–44e are formed has a reduced thickness, or thin portion 40b. The reduced thickness of thin portion 40b reduces the area of the side wall surface of each slit opening, so that light reflection from the side wall surfaces on each slit opening becomes unlikely and, thereby, substantially decreases the likelihood of the occurrence of a detection error.

An input portion and an output portion of each of the non-contact sensors 52a–52a are disposed on the base board 50 to eliminate the need for wire or cable connection to the base board 50, thereby reducing processing manhours and substantially preventing electromagnetic influences resulting from the elongated wiring.

The structural configuration of various components of the position detecting switch-combined electrical control unit according to the present invention, will now be described more in detail with reference to FIGS. 1–4. The case 10 may be formed from any material having good electrical insulation properties, such as, for example, resin. In order to provide a space for the tall elements 51b and a pad 15 for connecting a wire to a connector socket 14 along the outer circumference of the locus of the rotor's 40 rotation, the case 10 has a box-like shape where a portion of the case 10 corresponding to the outer arc of the fan shaped rotor 40 is generally rectangular.

The case 10 has a stepped hole 19 at a position corresponding to a pivot portion of the fan shaped rotor 40. The stepped hole 19 is configured so that a sleeve shaft portion 43 of the rotor 40 may be rotatably inserted therein. An oil seal (not shown) can be fitted onto a peripheral surface of the sleeve shaft portion 43 for sealing. The case chamber 12 provides a space for housing the base board 50 and allowing the rotor 40 to rotate. The chamber 12 has a stepped portion for positioning and fixing the base board 50 thereon. The pad 15 is disposed in a portion of the chamber's 12 stepped portion. The connector socket 14 is integrally formed with the case 10 and protrudes from a side of the case 10. The socket 14 transmits and receives signals. A pair of flanges 16 carry bolt-insert holes for fixing the case 10 to an automatic transmission casing. The flanges protrude from diagonally opposite portions of the case 10. A peripheral edge surface of the case 10 that meets a cover 20 has a seal ring groove 23 into which an O-ring (not shown) extending around the entire periphery of the case 10 is fitted.

The cover 20 may be made from the same kind of material as the case 10. Additionally, the cover 20 may be made from a material having good heat conductivity to accelerate the dissipation of heat from inside the case 10 to the external environment, such as, for example, a metallic material, such as an aluminum alloy. Also, the cover 20 may be configured to have heat-radiating fins that will increase the cover's 20 heat releasing efficiency. The shape of the cover 20 conforms to the external shape of the case 10. Ideally, the cover 20 is fixed to the case 10 by a socket-and-spigot coupling. As in the case 10, the cover 20 has a stepped hole 21 at a position corresponding to the pivot portion of the fan shaped rotor 40 for inserting the sleeve shaft portion 43 of the rotor 40 and fitting an oil seal (not shown) over the sleeve shaft to seal the periphery.

Preferably, the rotor 40 is made from the same material as the case 10. The sleeve shaft portion 43 of the rotor 40 is connected to an arm portion 41. The sleeve shaft portion 43 has a shaft hole 42 through which a manual shaft (not shown) is inserted. A half-length portion of the shaft hole 42 along the x-axis is cylindrical. The remaining half-length portion of the shaft hole 42 has opposite side surfaces extending in parallel from cylindrical inner peripheral surfaces, thereby reducing the width between the parallel side surfaces. The rotor 40 is positioned by rotatably fitting the sleeve shaft portion 43 into the stepped hole 19 of the case 10 and the stepped hole 21 of the cover 20 in such a manner that the arm portion 41 is positioned between the case 10 and cover 20 and extends into the case chamber 12.

The electronic control device base board 50 is made from a material having excellent heat resistance properties, such as, for example, ceramic. The circuit elements 51a and 51b, which include, but are not limited to, a microcomputer chip, transistors, resistors and capacitors, are arranged on a printed circuit formed on the surfaces of the base board 50. The base board 50 is fixed at one end to the stepped portion of the case chamber 12, and connected at the other end, at the pad 15, to a group 18 of terminal connecting lines of the connector socket 14 by wire bonding, for example. The terminal connecting line group 18 is lead through the case 10 and into the connector socket 14 for forming connection terminals therein. The connector socket 14 is connected to various sensors and solenoid valves in a hydraulic pressure control device disposed in the automatic transmission main body, in addition to sensors disposed in various parts of the vehicle and an engine control device.

The electronic control device base board 50 is positioned so that the board 50 is parallel to the rotor's 40 plane of rotation. The base board 50 has an overlap portion 50a, which is indicated by dotted lines in FIG. 1, that overlaps the locus of rotation of the rotor 40 when viewed in a direction perpendicular to the board surface and the plane of rotation. Looking at FIG. 2, among the plurality of circuit elements 51a and 51b, the elements 51a, such as, for example, resistors, have heights equal to or less than the required clearance to fit between the rotor 40 and the base board 50 and will be hereinafter, referred to as "low-height elements 51a". The low-height elements 51a are disposed on the obverse and reverse sides of the overlap portion 50a of the electronic control device base board 50 disposed as described above. As shown in FIGS. 1 and 2, the tall elements 51b, such as, for example, capacitors, are placed on the board portion 50b above the overlap portion 50a.

Each of the non-contact sensors 52a–52a, shown in FIGS. 1 and 2, constitute a position detecting switch in cooperation with the rotor 40. Each sensor 52a–52a includes a photo-sensor, or photo-interrupter, that has, as an output portion, a light-emitting portion formed of a light-emitting diode (LED), and as an input portion, a light-receiving portion formed of a photo-transistor. The detecting portions of the sensors 52a–52a are aligned on the base board 50 within the radius of the rotor 40. The surface of the arm portion 41 of the rotor 40 facing the photo-sensors 52a–52a forms a reflecting surface, while the multiple slits 44 formed over a substantial area of the arm portion 41 form light passing portions.

The arrangement of the slits 44 will be now described with reference to FIGS. 3 and 4. Row a is formed of a single slit 44a that is elongated in a circumferential direction. Row b has two slits $44b_1$ and $44b_2$ that are also elongated in the circumferential direction. Row c has slits $44c_1$ and $44c_3$ elongated in the circumferential direction and a short slit $44c_2$. Row d contains many slits 44d that are short in the circumferential direction. Row e also has many slits 44e that are short in the circumferential direction. The rows a–e begin at a position near the sleeve shaft portion 43 and extend radially outward thereof.

In a manner corresponding to the rotor 40, the base board 50 carries five lines of photo-sensors 52a–52a that are arranged in a direction of a radius of the rotor 40. The photo-sensor 52a is disposed corresponding to the row having slit 44a. Likewise, the photo-sensors 52b, 52c, 52d and 52e are disposed corresponding to the row b having slits $44b_1$ and $44b_2$, the row c having slits $44c_1$–$44c_3$, the row d having slits 44d, and the row e having slits 44e, respectively. Output signals from the photo-sensors 52a–52e are input to the transmission control computer directly from the printed circuit on the base board 50.

The operation of the position detecting switch will now be described. Looking at FIG. 3, when a "P" region of the rotor 40 faces the photo-sensors 52a–52e, light from the light-emitting portion of the photo-sensor 52a and light from the light-emitting portion of the photo-sensor 52c pass through the slit 44a and the slit $44c_1$, respectively, so that the counter light-receiving portions of the photo-sensors 52a and 52c do not receive light. Therefore, the detection signals from the photo-sensors 52a and 52c both turn off, that is, emit a "0". Light from the light-emitting portion of the photo-sensor 52b is reflected by the rotor 40 and received by the light-receiving portion of the photo-sensor 52b. Therefore, the detection signal from the photo-sensor 52b turns on, that is, emits a "1". Thus, the outputs from the photo-sensors 52a–52c form a three-bit signal of "010", which is recognized as the range position "P" by the transmission control computer.

If the rotor 40 is turned counterclockwise from the aforementioned position to the position where an "R" region faces the photo-sensors 52a–52e, only the detection signal for the photo-sensor 52a of the photo-sensors 52a–52c, turns off, that is, emits a "0", as understood from the relationship of the light passing and reflecting as described above. Therefore, the outputs from the photo-sensors 52a–52c form a three-bit signal of "011", which is recognized as the range position "R" by the transmission control computer. Likewise, if the rotor 40 is again turned counterclockwise to a position where an "N" region faces the photo-sensors 52a–52e, the outputs from the photo-sensors 52a–52c form a three-bit signal of "000", which is recognized as the range position "N" by the transmission control computer. If a "D" region faces the photo-sensors 52a–52e, the outputs from the photo-sensors 52a–52c form a three-bit signal of "101", which is recognized as the range position "D" by the transmission control computer. If a "3" region faces the photo-sensors 52a–52e, the outputs from the photo-sensors 52a–52c form a three-bit signal of "111", which is recognized as the range position "3" by the transmission control computer. If a "2" region faces the photo-sensors 52a–52e, the outputs from the photo-sensors 52a–52c form a three-bit signal of "110", which is recognized as the range position "2" by the transmission control computer. If an "L" region faces the photo-sensors 52a–52e, the outputs from the photo-sensors 52a–52c form a three-bit signal of "100", which is recognized as the range position "L" by the transmission control computer. Thus, the range position of the rotor 40 is detected by the control computer reading the output signals from the photo-sensors 52a–52c.

Further, a group of slits 44d are arranged outward of the row c of slits $44c_1$–$44c_3$, at a position corresponding to the photo-sensor 52d. Also, a group of slits 44e are arranged radially outward of the slit group 44d, at a position corresponding to the photo-sensor 52e. The slits 44d and the slits 44e are shifted in phase. The two groups of slits 44d and 44e form the learning control slit rows according to the present invention.

As the rotor 40 rotates so that the photo-sensors 52d and 52e move relative to the rows of slits 44d and 44e from the "P" region to the "L" region, the photo-sensors 52d and 52e output pulse signals that differ in phase by 90°. Pulses are obtained at the rise and fall of each pulse signal from the sensors 52d and 52e. Therefore, 64 pulses in total are generated over the entire rotational range of the shift lever.

Figure 5:
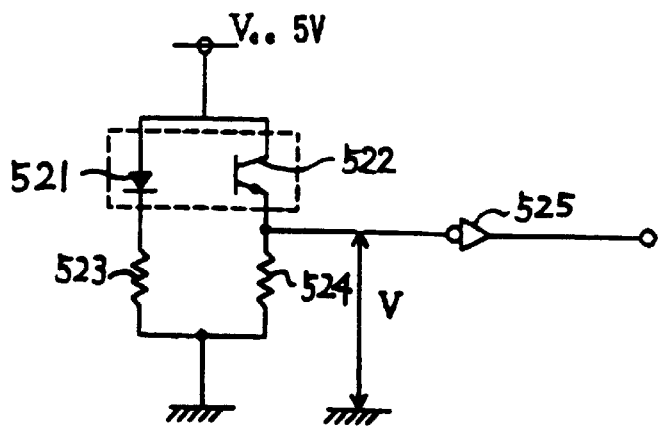
FIG. 5 illustrates the circuit of a non-contact sensor of the position detecting switch of the combined control unit of FIG. 1.

The generation of pulses will now be described in detail with reference to FIGS. 5–7. As shown in FIG. 5, each of the photo-sensors 52a–52e has a light-emitting diode 521 and a photo-transistor 522 which are connected in parallel at corresponding positions. The slitted rotor 40 is used as a switching device in an optical path between the light-emitting diode 521 and the photo-transistor 522. A power voltage of constant current Vcc (5 V) is applied to each of the photo-sensors 52a–52e. A cathode-side of the light-emitting diode 521 of each photo-sensor 52a–52e is grounded, via a resistor 523, and the photo-transistor 522 is grounded, via a resistor 524. The electric potential difference between the photo-transistor 522 and the resistor 524 is applied to an inverter 525. In turn, the output signal from the inverter 525 is output to the transmission control computer. As the rotor 40 is rotated, a sine-wave output voltage V is generated, as indicated in an upper portion of FIG. 6. The sine-wave changes depending on whether the photo-transistor 522 receives light from the light-emitting diode 521. The output voltage V is inverted by the inverter 525 so that rectangular pulse waves, as indicated in a lower portion of FIG. 6, are output from the inverter 525.

Figure 6:
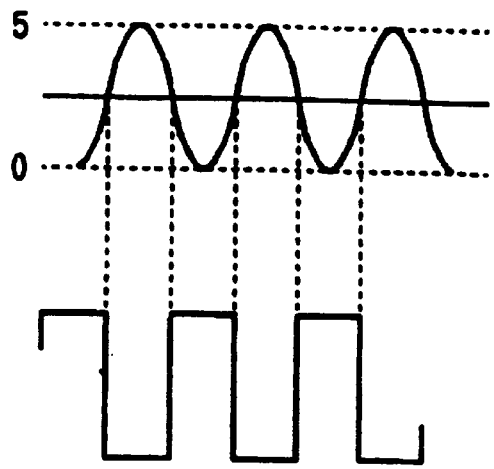
FIG. 6 is a graph illustrating the relationship between the photo-transistor output voltage of the non-contact sensor and the inverter output pulse waveform of the combined control unit of FIG. 1.
Figure 7:
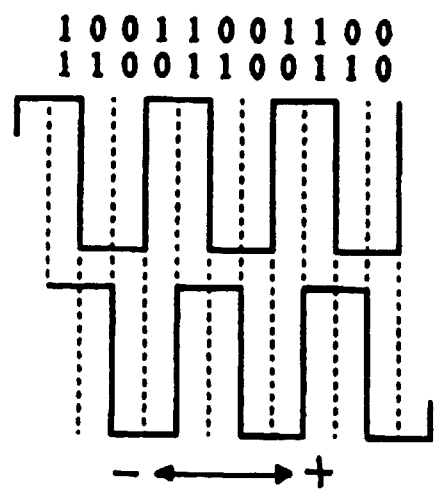
FIG. 7 is a graph illustrating the phase difference of the inverter output pulses and the switch on/off signals of the combined control unit of FIG. 1.

Therefore, the pulse wave outputs from the photo-sensors 52d and 53e are rectangular pulse waves as indicated in FIG. 6. The pulse waves for the photo-sensors 52d and 52e differ in phase by 90°, as indicated in FIG. 7. Waves differ in phase by 90° because the group of slits 44d and 44e are arranged such that the signal outputs by the slit groups 44d and 44e are shifted in phase by 90°. Because the pulses are output in this manner, the two-bit switch on/off signal obtained by combining the pulses from the photo-sensors 52d and 52e at the "−" side of a predetermined position is always different from the two-bit switch on/off signal obtained by combining the pulses from the photo-sensors 52d and 52e at the "+" side of that position. Based on the combined two-bit switch on/off signals, the transmission control computer is able to determine in which direction, that is, the "−" or "+" direction, the rotor 40 rotates.

Furthermore, the transmission control computer is able to detect the position of the rotor 40 by counting the rise and fall of each pulse and using the counted number of pulses as a basis. Thus, it is possible to perform learning for position alignment of the position detecting switch according to the present invention, as will now be described below.

Figure 8:
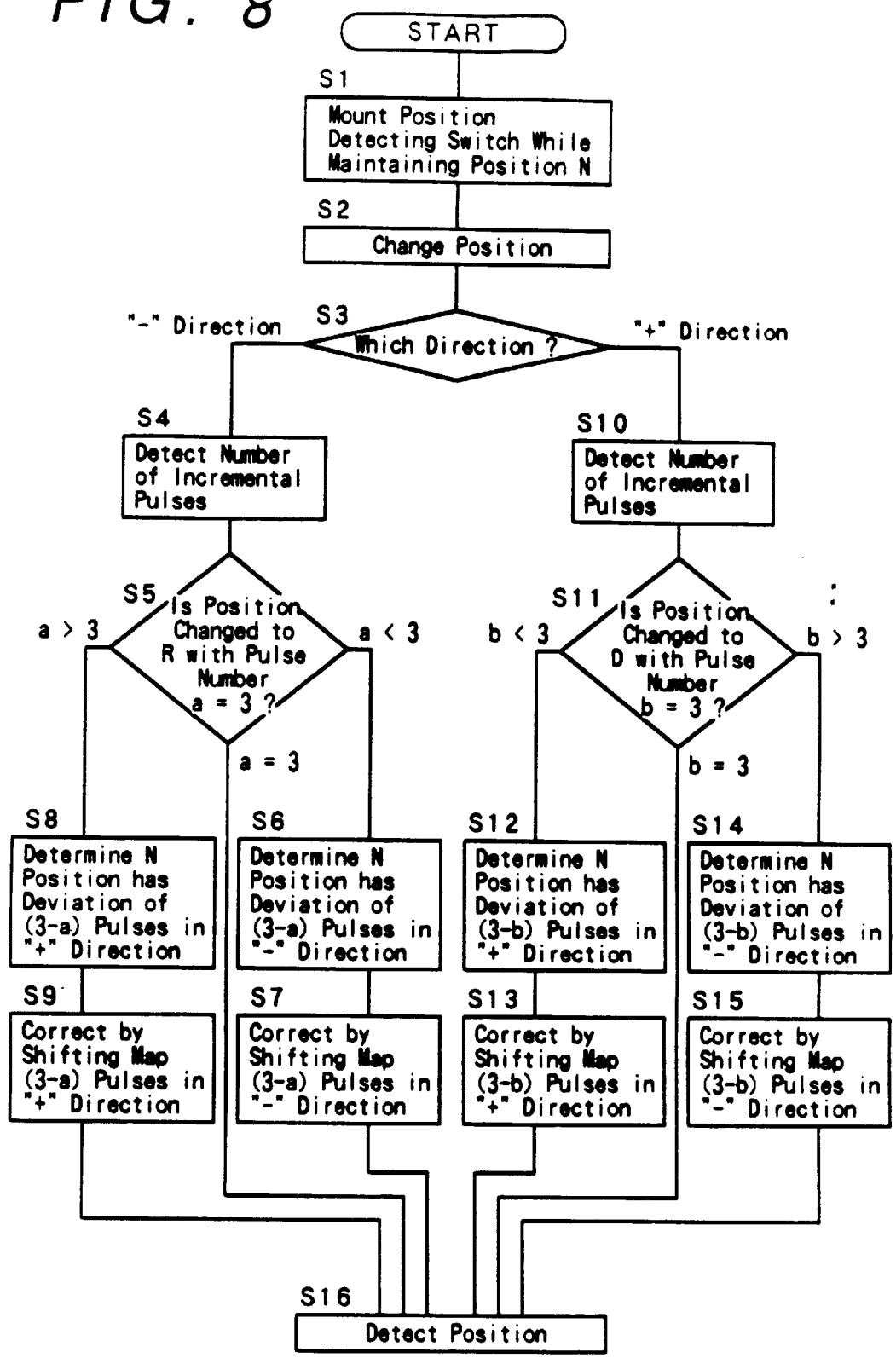
FIG. 8 is a block diagram of the learning control of the electronic control unit of FIG. 1.
Figure 9:
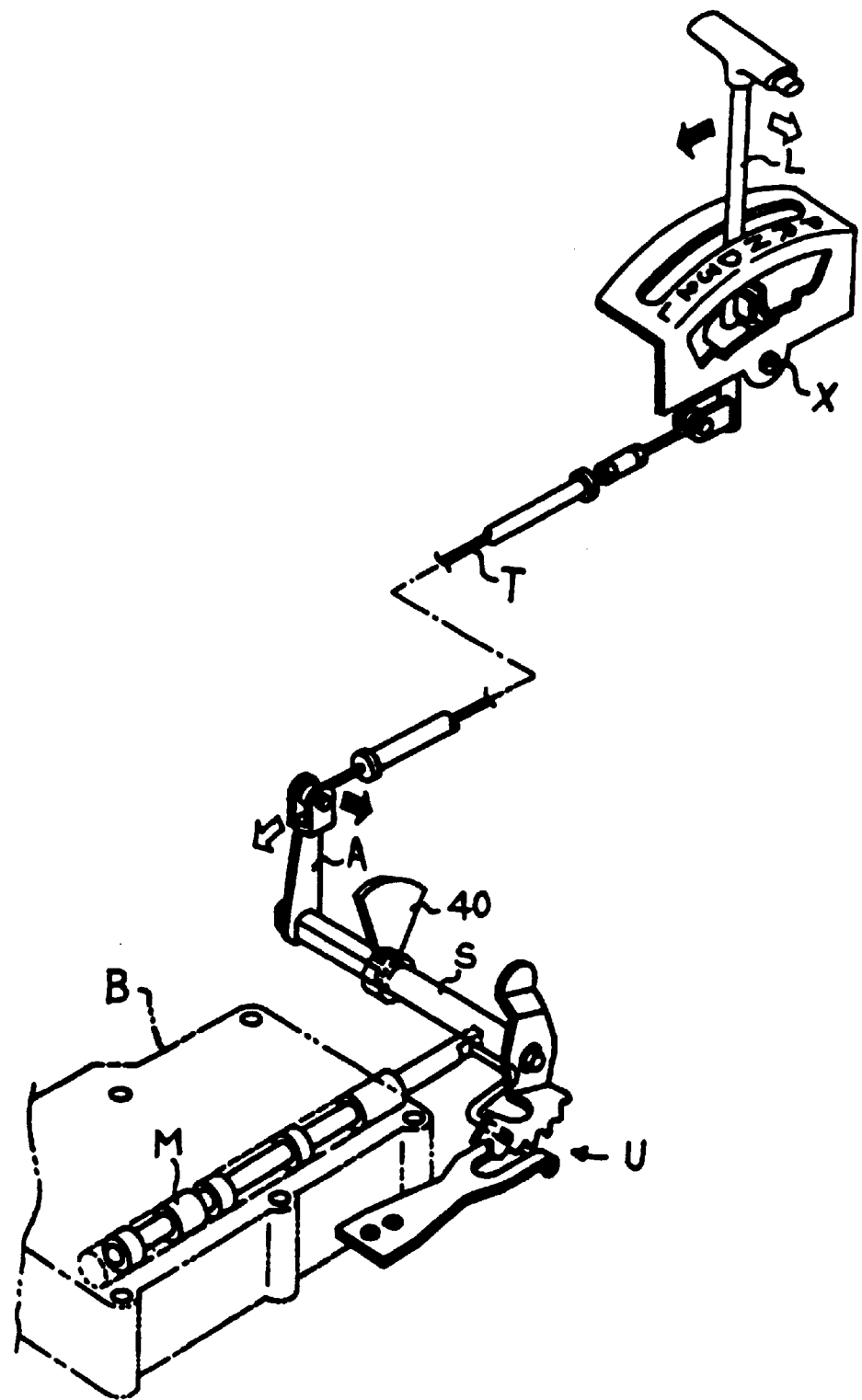
FIG. 9 is an exploded perspective view of the shift device and the automatic transmission main body.

The setting of the "N", or neutral, position of the position detecting switch using a learning control program, according to the present invention, eliminates the need for position alignment at the time the control unit is mounted on the automatic transmission casing. The setting of the control unit will be described with reference to the block diagram of FIG. 8. In step S1, using a detent mechanism U, a manual valve M is maintained in the neutral range to fix the manual shaft S in an angular position, as shown in FIG. 9. Also, the control unit is mounted on the automatic transmission casing while the manual shaft S penetrates the shaft hole 42 of the control unit's rotor 40. After which, a control wire T is link-connected and the wire length is adjusted, while the shift level L of a shift device is maintained at the "N" position.

When the electronic control unit is fixed to the automatic transmission casing in this manner, a turning motion of the shift lever L of the shift device around the shaft is transmitted as understood from the relation among the operating mechanisms shown in FIG. 9. That is, a turning motion of the shift lever L is transmitted by the control wire T to the outer lever A of the automatic transmission main body, thereby turning the manual shaft S. The turning motion of the manual shaft S rotates the rotor 40 which is connected to the manual shaft S. FIG. 9 shows a state where the shift lever L is at the neutral range, or "N", position. If the shift lever L is pushed from this position forward, that is, either toward the reverse range, or "R", position or the parking range, or "P", position, the wire T is pushed, so that the outer lever A turns in a direction indicated by a blanked arrow in FIG. 9. If the shift lever L is pulled rearward, that is, either toward the drive range, or "D" position, the third range, or "3", position, the second range, or "2", position or the low range, or "L", position, the wire T is pulled, so that the outer lever A turns in a direction indicated by the solid arrow in FIG. 9. During such operation, the position detecting switch switches and, simultaneously, the manual valve M in the valve body B of the hydraulic pressure control device slidingly switches.

Referring back to FIG. 8, position changing is performed by actually operating the shift lever L in step S2. In step S3, it is checked whether the direction of the position change is in the "−" direction, for example, toward the "R" range position, or in the "+" direction, for example, toward the "D" range position, on the basis of the first incremental pulse generated in conjunction with the row d and e of slits 44d and 44e of the position detecting switch. Determination of the direction is described above with reference to FIG. 7.

If position change is being made in the "−" direction, the number of incremental pulses necessary to complete the position change is detected in step S4. If it is determined in step S5 that the position is changed to the "R" range position with the number a of pulses being 3, the position detecting switch and the manual shaft S are considered to be in the correct positional relationship. Therefore, the map stored in the transmission control computer is not corrected, and the operation proceeds to step S16, where position detection is performed. If it is determined in step S5 that the number a of pulses is less than 3 (a<3), which means that the present "N" position has a deviation of (3−a) number of pulses in the "−" direction, it is determined so in step S6. Subsequently, correction is made in step S7 by shifting the map by (3−a) number of pulses in the "−" direction. Position detection is then performed in step S16. If it is determined in step S5 that the number a of pulses is greater than 3 (a>3), it is determined in step S8 that the "N" position has a deviation of (a−3) number of pulses in the "+" direction. After correction is made in step S9 by shifting the map by (a−3) number of pulses in the "+" direction, position detection is performed in step S16.

If it is determined in step S3 that position change is being made in the "+" direction, the number of incremental pulses necessary to complete the position change is detected in step S10. If it is subsequently determined in step S11 that the position is changed to the "D" range position with the number b of pulses being 3, the position detecting switch is considered to have been mounted in the correct position. Therefore, the operation immediately proceeds to step S16, where position detection is performed. If it is determined in step S11 that the number b of pulses is less than 3 (b<3), it is determined in step S12 that the "N" position has a deviation of (3−b) number of pulses in the "+" direction. Subsequently, correction is made in step S13 by shifting the map by (3−b) number of pulses in the "+" direction, and position detection is then performed in step S16. If it is determined in step S11 that the number b of pulses is greater than 3 (b>3), it is determined in step S14 that the "N"

position has a deviation of (b−3) number of pulses in the "−" direction. After correction is made in step S15 by shifting the map by (b−3) number of pulses in the "−" direction, position detection is performed in step S16.

Figure 10:
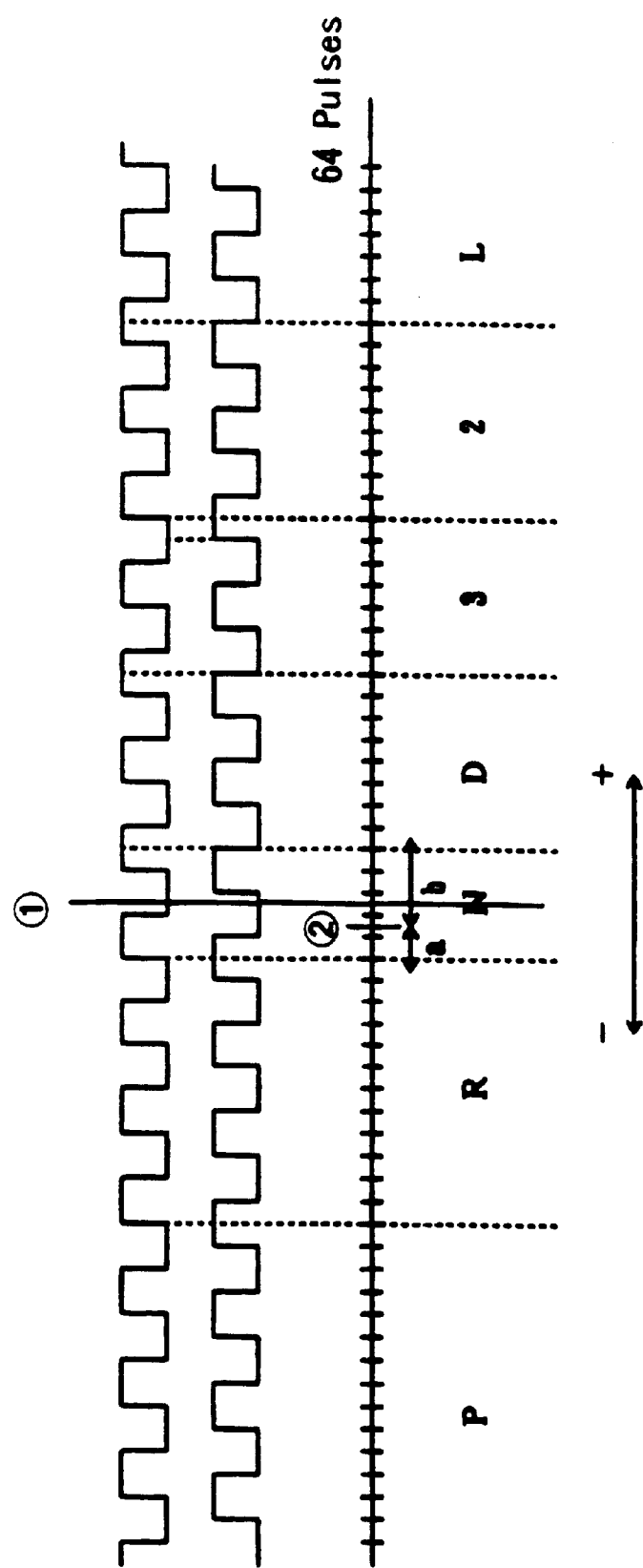
FIG. 10 is a graph illustrating the relationship between the movement of the rotor and the number of output pulses of the position detecting switch of the combined control unit of FIG. 1.

FIG. 10 indicates an actual example of the learning control. If the correct position is a position indicated by (1) in FIG. 10 and the mounted position is a position indicated by (2), then a=2, and b=4. If the position is changed in the "−" direction, correction is made by shifting the map one pulse in "−" direction through the operation of steps S4–S7 before position detection is performed. Conversely, if the position is changed in the "+" direction, correction is made by shifting the map one pulse in "+" direction through the operation of steps S10, S11, S14 and S15 before position detection is performed.

The relationship between the individual range positions, moving direction and number of pulses from the "N" range position is shown in FIG. 11a–11c. Looking at FIG. 11a where no correction is needed, with the reference point defined at the center of the "N" range position, the range of pulse numbers 2 to −2, that is, 2 incremental pulses in the "+" direction and 2 incremental pulses in the "−" direction, is determined as the "N" region. The range of pulse numbers −3 to −14, or 3 to 14 incremental pulses in the "−" direction, is determined as the "R" region. The range of pulse numbers −15 or less is determined as the "P" region. In the "+" direction, the range of 3 to 10 incremental pulses is determined as the "D" region; the range of 11 to 17 incremental pulses is determined as the "3" region; the range of 18 to 26 incremental pulses is determined as the "2" region; and the range of 27 incremental pulses or more is determined as the "L" region. Therefore, even if the position detecting switch is mounted at an angular position outside the "N" region, position detection can be performed by counting the number of incremental pulses and correcting the map based on the count as illustrated in FIGS. 11b and 11c.

Figure 12:
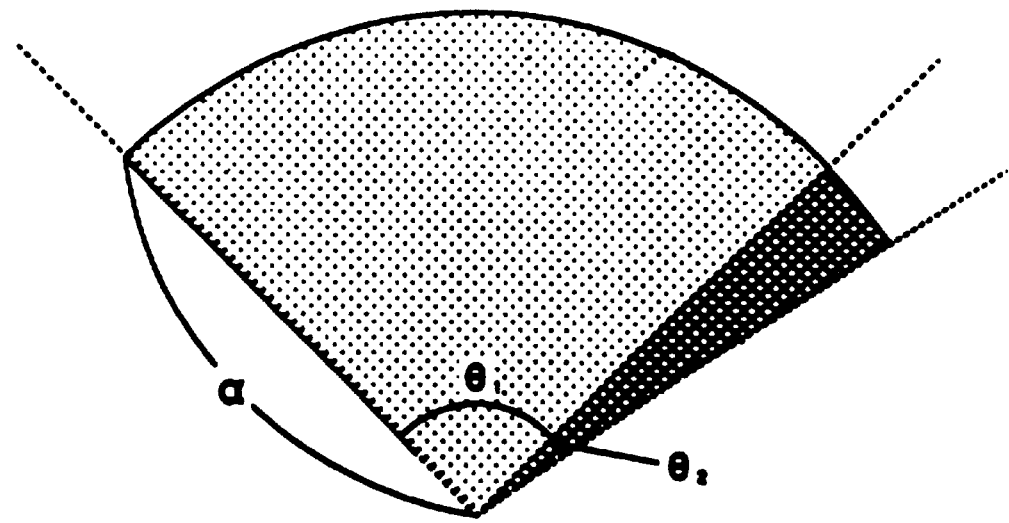
FIG. 12 illustrates the area occupied by a related art control unit.
Figure 13:
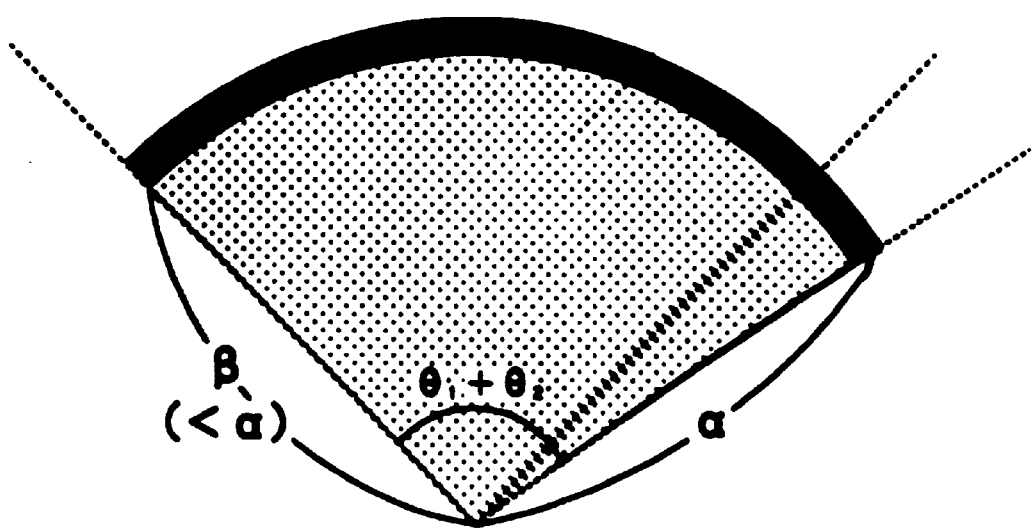
FIG. 13 illustrates the area occupied by the combined control unit of FIG. 1.

As understood from the foregoing description, the embodiment of the invention provides a compact-size control unit due to the above-described learning control. FIGS. 12 and 13 illustrate the difference in size between the related art and the invention, respectively. In the related art, as shown in FIG. 12, a case of a sector shape having a radius a and a central angle $\theta_1$, in accordance with the rotating range of the rotor is rotated around a shaft within an angle of $\theta_2$, for alignment to the neutral position. Therefore, the related art requires a position alignment space indicated by a grid pattern in FIG. 12. In contrast, with the integration technology according to the present invention as shown in FIG. 13, the case configuration can be enlarged in the sector central angle by an amount corresponding to the conventional position alignment space, that is, to a central angle, $\theta_1+\theta_2$. Therefore, the case according to the present invention can have a correspondingly reduced radius $\beta(\beta<\alpha)$, provided that the area of the circuit base board disposed in the case remains the same. Furthermore, since circuit elements 51a and 51b can be disposed in a space outward of the thus-increased rotational angle range of the rotor 40, the amount of the conventionally dead space can be fully used.

In short, according to the invention, as many low-height elements 51a as possible are disposed in the overlap portion 50a of the electronic control device circuit board while tall elements 51b are disposed outside the overlap portion 50a. This arrangement further integrates the element arrangement on the circuit board on the basis of considerations of the conventional element arrangement, where tall elements 51b and low-height elements 51a are disposed on the board surface 50 in a mixed manner, mainly for electrical reasons. The invention thus achieves size reductions in area and thickness.

While the invention has been described with reference to the preferred embodiment, the invention is not limited to the embodiment and structures disclosed. For example, the position detecting switch may employ a magnetic sensor. In that case, it is also possible to use a magnet on the rotor and use a Hall element or a magnetoresistance element on the non-contact sensor side. Although, in the foregoing embodiment, the base board 50 is disposed between rotor 40 and a wall of the case 10 on the side attached to the automatic transmission casing, the base board 50 may optionally be disposed between the rotor 40 and the cover 20. In that case, maintenance operations of the electronic control device, such as, for example, replacement of the base board 50, become simpler. In addition, if the inter-surface distance between the base board 50 and the cover 20 is reduced and the cover 20 is formed of a highly heat-conductive material member, the heat dissipation will be further improved.

While the invention has been described in conjunction with a specific embodiment thereof, it is evident that many alternatives, modifications and variations may be apparent to those skilled in the art. Accordingly, the preferred embodiment of the invention as set forth herein is intended to be illustrative, not limiting. Various changes may be made without departing from the spirit and scope of the invention as defined in the following claims.

What is claimed is:

1. A position detecting switch-combined electronic control unit for an automatic transmission, comprising:

a base board having a plurality of elements disposed thereon, the plurality of elements including a microcomputer containing an automatic transmission control program;

a position detecting switch having a detecting portion connected to the microcomputer;

the position detecting switch and the base board disposed together within a case;

the position detecting switch also having a rotor and a plurality of non-contact sensors provided on the base board, the plurality of non-contact sensors being disposed proximate to the rotor as the detecting portion for detecting rotation of the rotor;

the microcomputer also containing a learning control program for calculating and correcting a positional deviation in a rotational angle of the rotor with respect to each of the plurality of non-contact sensors, on the basis of a signal from each sensor corresponding to the rotation of the rotor; and at least some of the plurality of elements disposed on the base board are arranged outside a range of rotation of the rotor.

2. The position detecting switch-combined electronic control unit for an automatic transmission according to claim 1, wherein the at least some of the plurality of elements disposed on the base board arranged outside the range of rotation of the rotor have heights greater than a clearance between the base board and the rotor.

3. The position detecting switch-combined electronic control unit for an automatic transmission according to claim 1, wherein the plurality of elements are distributed to first and second sides of the base board.

4. The position detecting switch-combined electronic control unit for an automatic transmission according to claim 2, wherein the rotor has a plurality of rows of slits for causing the non-contact sensors to output signals, at least two rows of the plurality of rows of slits are formed as learning control slit rows extending from a first side of the rotor to a second side of the rotor so that the plurality of non-contact sensors output incremental signals to the microcomputer in accordance with the rotation of the rotor.

5. The position detecting switch-combined electronic control unit for an automatic transmission according to claim 3, wherein the rotor has a plurality of rows of slits for causing the non-contact sensors to output signals, at least two rows of the plurality of rows of slits are formed as learning control slit rows extending from a first side of the rotor to a second side of the rotor so that the plurality of non-contact sensors output incremental signals to the microcomputer in accordance with the rotation of the rotor.

6. The position detecting switch-combined electronic control unit for an automatic transmission according to claim 4, wherein the learning control slit rows are formed in a radially outward portion of the rotor.

7. The position detecting switch-combined electronic control unit for an automatic transmission according to claim 5, wherein the learning control slit rows are formed in a radially outward portion of the rotor.

8. The position detecting switch-combined electronic control unit for an automatic transmission according to claim 6, wherein an outer edge portion of the rotor has an increased thickness, and an inner portion of the rotor in which the plurality of rows of slits are formed has a reduced thickness.

9. The position detecting switch-combined electronic control unit for an automatic transmission according to claim 7, wherein an outer edge portion of the rotor has an increased thickness, and an inner portion of the rotor in which the plurality of rows of slits are formed has a reduced thickness.

10. The position detecting switch-combined electronic control unit for an automatic transmission according to claim 8, wherein an output and an input portion of each non-contact sensor are arranged on the base board.

11. The position detecting switch-combined electronic control unit for an automatic transmission according to claim 9, wherein an output and an input portion of each non-contact sensor are arranged on the base board.

12. A compact-sized, position detecting switch-combined electronic control unit disposed on the main body of an automobile transmission for detecting the range position chosen by a driver during a selecting operation, the combined control unit, comprising:

- a base board having a plurality of circuit elements disposed on the base board, the circuit elements including a microcomputer containing an automatic transmission control program;
- a position detecting switch having a rotor, a plurality of non-contact sensors and a detecting portion provided on the base board, the non-contact sensors located proximate to the rotor and used as a detecting portion for detecting rotation of the rotor, the detecting portion being connected to the microcomputer;
- a range of rotation of the rotor;
- a learning control program within the microcomputer, the program being capable of calculating and correcting a positional deviation in a rotational angle of the rotor with respect to each of the non-contact sensors based on a signal from each non-contact sensor corresponding to the rotation of the rotor; and
- a case wherein the base board and position detecting switch are disposed together.

13. The position detecting switch-combined electronic control unit for an automatic transmission according to claim 12, wherein the circuit elements includes a first set and a second set of circuit elements, the first set of circuit elements have a height greater than a clearance between the rotor and the base board.

14. The position detecting switch-combined electronic control unit for an automatic transmission according to claim 13, wherein the first set of circuit elements are disposed outside the range of rotation of the rotor.

15. The position detecting switch-combined electronic control unit for an automatic transmission according to claim 14, wherein the second set of circuit elements have a height less than the clearance between the rotor and the base board and are disposed within the range of rotation of the rotor.

16. The position detecting switch-combined electronic control unit for an automatic transmission according to claim 15, wherein the rotor has a plurality of slit rows extending radially outward along the rotor, the slit rows permit the non-contact sensors to output signals.

17. The position detecting switch-combined electronic control unit for an automatic transmission according to claim 16, wherein the plurality of slit rows includes a set of learning control slit rows extending from a first side of the rotor to a second side of the rotor, whereby the non-contact sensors transmit signals to the microcomputer based on the rotation of the rotor.

18. The position detecting switch-combined electronic control unit for an automatic transmission according to claim 17, wherein the learning control slit rows are formed in a radially outward portion of the rotor.

19. The position detecting switch-combined electronic control unit for an automatic transmission according to claim 18, wherein the rotor has an increased thickness portion and a decreased thickness portion, the increased thickness portion being at an outer edge portion of the rotor and the decreased thickness portion being at an inner portion of the rotor.

20. The position detecting switch-combined electronic control unit for an automatic transmission according to claim 19, wherein the non-contact sensors have an input and an output portion, the input and output portion of each non-contact sensor being arranged on the base board.

21. The position detecting switch-combined electronic control unit for an automatic transmission according to claim 14, wherein the first and second set of circuit elements are located on first and second sides of the base board.

22. The position detecting switch-combined electronic control unit for an automatic transmission according to claim 21, wherein the second set of circuit elements have a height less than the clearance between the rotor and the base board and are disposed within the range of rotation of the rotor.

23. The position detecting switch-combined electronic control unit for an automatic transmission according to claim 22, wherein the rotor has a plurality of slit rows extending radially outward along the rotor, the slit rows permit the non-contact sensors to output signals.

24. The position detecting switch-combined electronic control unit for an automatic transmission according to claim 23, wherein the plurality of slit rows includes a set of learning control slit rows extending from a first side of the rotor to a second side of the rotor, whereby the non-contact sensors transmit signals to the microcomputer based on the rotation of the rotor.

25. The position detecting switch-combined electronic control unit for an automatic transmission according to claim 24, wherein the learning control slit rows are formed in a radially outward portion of the rotor.

26. The position detecting switch-combined electronic control unit for an automatic transmission according to claim 25, wherein the rotor has an increased thickness portion and a decreased thickness portion, the increased thickness portion being at an outer edge portion of the rotor and the decreased thickness portion being at an inner portion of the rotor.

27. The position detecting switch-combined electronic control unit for an automatic transmission according to claim 26, wherein the non-contact sensors have an input and an output portion, the input and output portion of each non-contact sensor being arranged on the base board.

\* \* \* \* \*